United States Patent [19]

Heppinstall et al.

[11] Patent Number: 4,820,996
[45] Date of Patent: Apr. 11, 1989

[54] AMPLIFYING ARRANGEMENTS

[75] Inventors: Roy Heppinstall, Witham; Paul Eaton, Broadfield; George I. F. Tupper, High Wycombe; Edmund K. Tunstall, Charlton on Otmoor, all of United Kingdom

[73] Assignees: English Electric Valve Company Limited, Chelmsford; British Broadcasting Corporation, London, both of United Kingdom

[21] Appl. No.: 8,192

[22] Filed: Jan. 29, 1987

[30] Foreign Application Priority Data

Jan. 30, 1986 [GB] United Kingdom ................. 8602235

[51] Int. Cl.$^4$ ............................................. H03F 3/56
[52] U.S. Cl. ......................................... 330/45; 332/7

[58] Field of Search ................ 315/5, 5.28, 5.34, 5.37, 315/5.41; 330/44, 45; 332/7; 358/186

[56] References Cited

U.S. PATENT DOCUMENTS

| 3,473,125 | 10/1969 | Babillon ................................... 332/7 |
| 3,740,649 | 6/1973 | Itoh ..................................... 332/7 X |
| 4,591,799 | 5/1986 | Faillon et al. ......................... 330/45 |

*Primary Examiner*—Steven Mottola
*Attorney, Agent, or Firm*—Spencer & Frank

[57] ABSTRACT

An amplifying arrangement includes a klystron in which an electron beam interacts with a high frequency signal to produce a modulated amplified signal. The high frequency signal is maintained at a substantially constant amplitude and modulation of the amplified signal is provided by controlling the electron beam current.

4 Claims, 3 Drawing Sheets

AMPLIFYING ARRANGEMENTS

BACKGROUND OF THE INVENTION

This invention relates to amplifying arrangements employing klystrons or like devices and more particularly, but not exclusively, to such arrangements comprising television transmitters.

In a television transmitter, typically a klystron amplifies a radio frequency carrier, which has been modulated with either a video signal, or with video or sound signals simultaneously, the latter mode of operation being known as a "multiplexed" mode.

A "klystron" is a device for amplifying high frequency signals. A typical klystron comprises an electron gun section and an interaction region. The electron gun section includes a cathode at which electrons are emitted in a beam, and a beam controlling electrode which controls the magnitude of the electron beam current. The interaction region comprises a cavity at which the high frequency signal to be amplified velocity modulates the electrons of the beam, and typically comprises several cavities, the amplified signal being taken from the final one.

The present invention seeks to provide an improved klystron arrangement.

SUMMARY OF THE INVENTION

According to this invention, there is provided an amplifying arrangement including a klystron, means for applying a high frequency carrier to an interaction cavity of the klystron, and means for controlling the beam current of the klystron whereby the high frequency carrier is maintained at a substantially constant amplitude and modulation desired on the amplified signal is substantially provided by controlling the electron beam current. The present inventors have realised that although the power transfer charactristic, i.e., the relationship between the power of the high frequency signal applied to the klystron and that of the amplified signal at an output cavity of the klystron, is different for different beam currents, it is possible to achieve efficient operation whilst maintaining the input power at a substantially constant amplitude. This is illustrated in FIG. 1, which shows the power of the high frequency signal applied to the input cavity of the klystron along the abscissa and that of the amplified output signal along the ordinate. The power transfer characteristics for several different beam currents are shown. In accordance with the invention, the power of the input signal is maintained at P1 even though substantial amplitude modulation is required on the output signal. As can be seen, the maximum output power for a number of transfer characteristics occurs at input powers which are substantially the same. Thus efficient operation of the klystron may be achieved, whilst simplifying the circuitry required to control and operate the klystron.

Preferably, the input high frequency signal is maintained at a first substantially constant amplitude when an output amplified signal is required which falls within one range of amplitudes and at a second substantially constant amplitude different from the first when an output amplified signal is required which falls within another, substantially, different range of amplitudes. This is particularly advantageous when the klystron is employed in a television transmitter, and much greater output power is required for sync signals than during the "picture" periods of the TV signal.

Preferably the electron beam current is controlled by a grid for controlling the magnitude of the electron beam current, thus enabling the magnitude of the beam current to be altered without substantially changing the beam shape. However klystrons other than gridded klystrons may be employed, for example a klystron having its beam current controlled by an annular electrode may be used, or alternatively a klystron in which a modulating anode is used. In these two types of klystron the beam controlling electrode which has its potential controlled is either the annular electrode or the modulating electrode as appropriate.

BRIEF DESCRIPTION OF DRAWINGS

The invention is now further described by way of example with reference to the accompanying drawings, in which.

DESCRIPTION OF PREFERRED EMBODIMENTS

Figure 2:
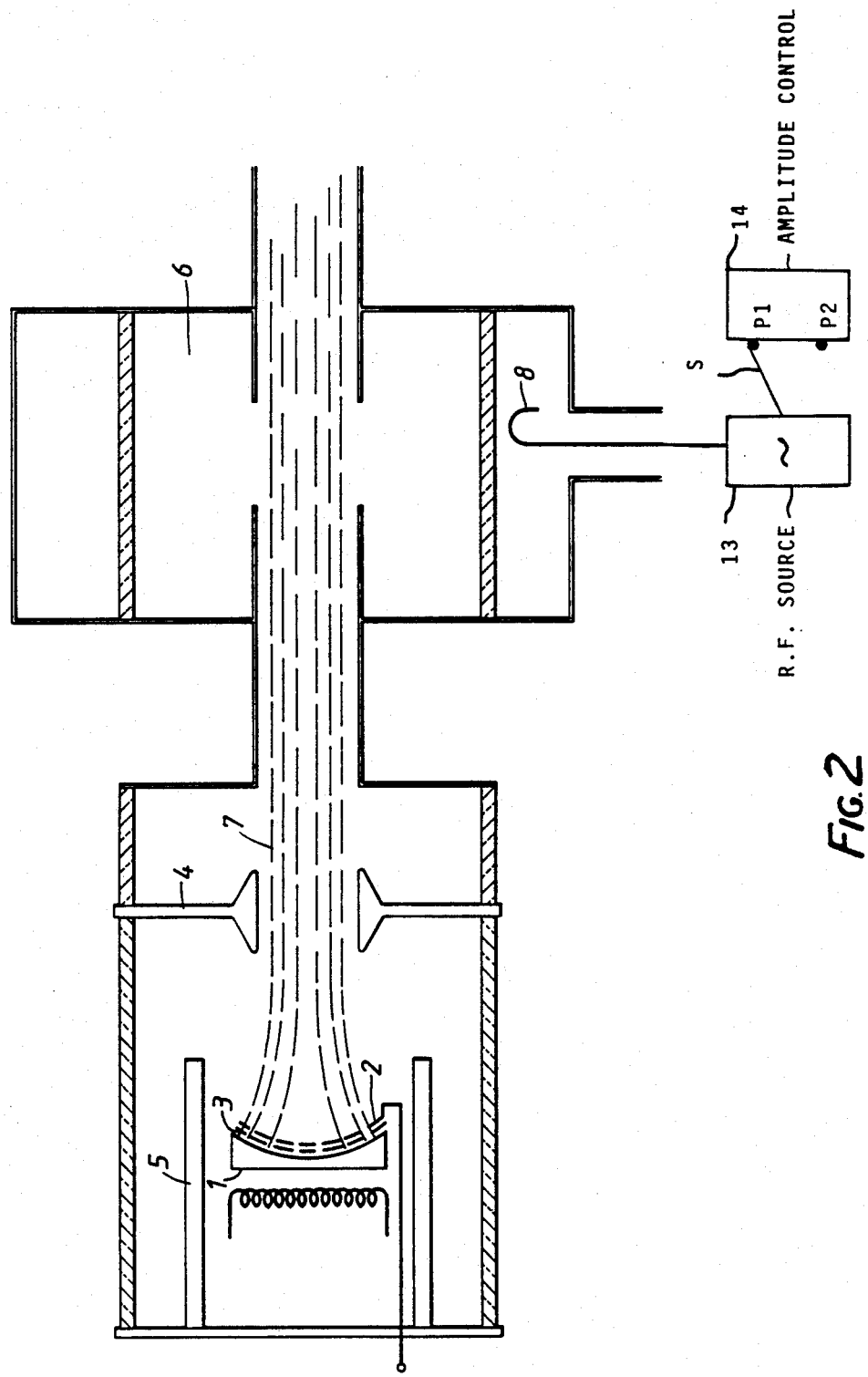
FIG. 2 schematically illustrates part of a klystron and its amplitude control in accordance with the invention.

With reference to FIG. 2, a television broadcasting arrangement includes a klystron for amplifying a radio frequency signal prior to its transmission and imposing a required modulation thereon, the radio frequency signal comprising a plain carrier, i.e., one which is not modulated. The klystron has an electron gun section comprising a cathode 1, a grid 2, a shadow grid 3, a modulating anode 4 and an annular focussing electrode 5. The klystron also includes a radio frequency section comprising several cavities, only the first cavity 6 of which is shown. The annular focussing electrode 5 is at cathode potential as is the shadow grid 3 which is in register with the grid 2 and is located between it and the cathode 1 to prevent emitted electrodes impinging on the grid 2. During operation of the klystron, electrons are emitted from the cathode 1 in a beam 7 directed along the longitudinal axis of the klystron. The carrier is coupled into the first cavity 6 at 8, and velocity modulates the electrons of the beam 7.

The electron beam current is modulatd by varying the potential of the grid 2. The interaction of the carrier signal and the electrons of the beam produces an amplified modulated signal which is coupled from the final cavity and applied to an antenna for radiation. The electrons of the beam 7 are collected beyond the final cavity at a collector (not shown).

Figure 1:
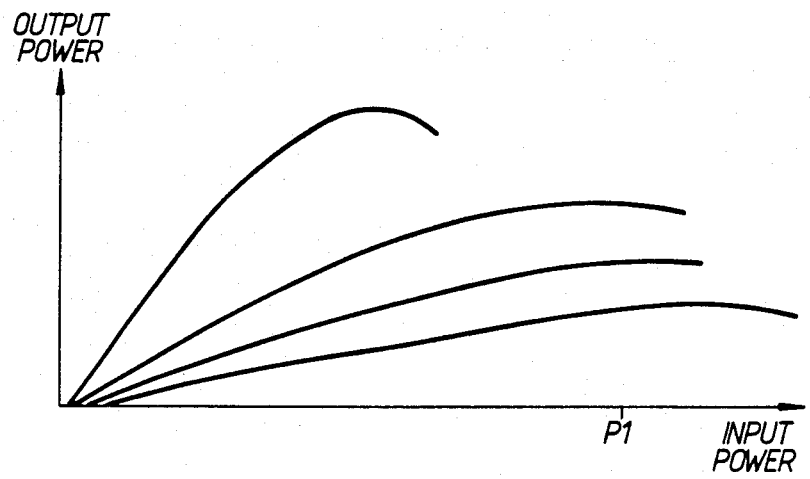
FIG. 1, referred to above, is an input-output graph showing the operation of a Klystron.
Figure 3:
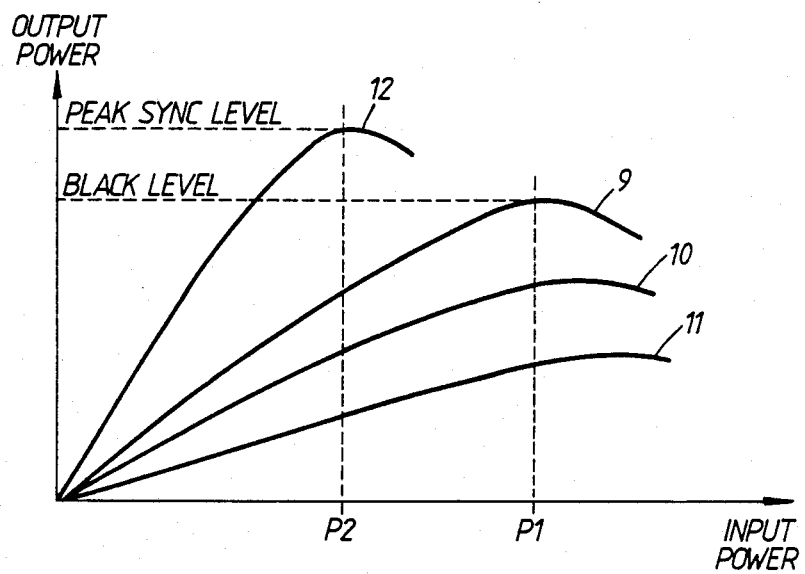
FIG. 3 is an explanatory diagram illustrating the operation of the klystron of FIG. 2.
Figure 4:
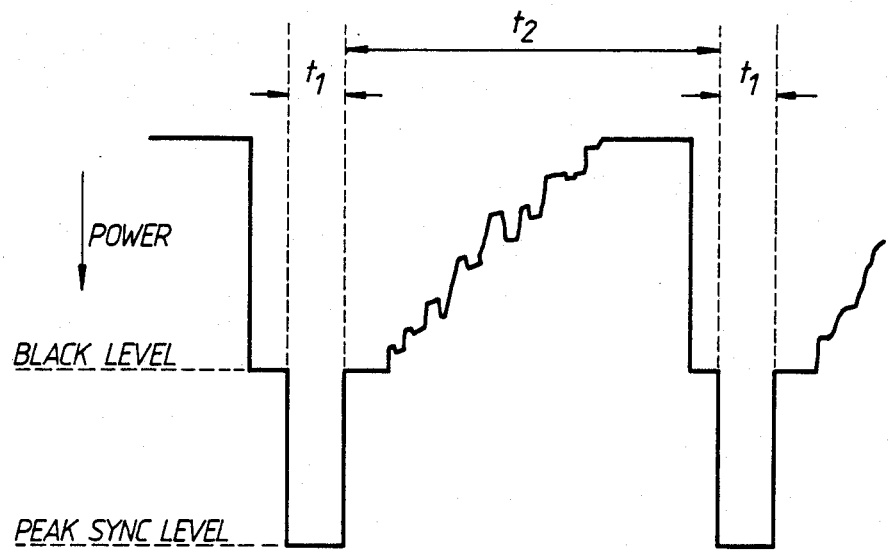
FIG. 4 shows part of a television signal.

FIG. 3 illustrates the power transfer characteristics of the klystron illustrated in FIG. 2. Curves are shown for the characteristic at four different beam currents. The most efficient operation for three of the beam currents, the characteristic curves of which are illustrated at 9, 10 and 11 are shown to exist at a similar input power level P1. However, for another higher beam current, the power transfer characteristic at this level being illustrated by the curve 12, it can be seen that the most efficient operation occurs at a much lower input power level P2. Thus means are provided for switching an RF source between one input power level P1 controlled at 14 where a power output is desired which requires beam currents as represented by curves 9, 10 and 11, and P2 when higher output power is required and the beam current whose characteristic is illustrated at 12 must be employed. This consideration is particularly applicable to television broadcasting apparatus, as may be seen from the television signal represented in FIG. 4, where the power increases in a direction as shown. As can be seen, the signal is divided into sync periods $t_1$ and picture periods $t_2$. A large power output is required during the sync periods whereas the output power level during the picture period varies over a smaller, different range of output power levels. Thus, during the sync periods $t_1$, the amplitude of the input signal is adjusted by a suitable switch S connected to amplitude control 14 so that it lies at P2, as shown in FIG. 3. Thus, the desired peak sync output power may be achieved to give efficient operation. Then during the picture period $t_2$, the amplitude of the input power is readjusted and switched to input power level P1 as illustrated in FIG. 3. By this mode of operation the beam current tends to be minimised for the average level of picture during network signals. The phase of the high frequency input to the first cavity is continuously controlled relative to the video signal on the grid to correct the incidental phase variations at the output of the klystron. Differential gain, differential phase and low frequency linearity are precorrected on the video signal applied to the grid 4.

Of course, the present invention may be applied to klystrons having power transfer characteristics other than those illustrated.

We claim:

1. An amplifying arrangement including a klystron; means for applying a substantially constant amplitude high frequency carrier to an interaction cavity of the klystron; and means for modulating the electron beam current of the klystron while the carrier applied to the interaction cavity is at a substantially constant amplitude, whereby said high frequency carrier is maintained at said substantially constant amplitude and substantially all modulation desired on an amplified signal is provided by modulating said electron beam current.

2. An arrangement as claimed in claim 1 wherein said means for modulating said electron beam current comprises a grid for controlling the magnitude of said electron beam current.

3. An amplifying arrangement comprising a klystron; means for applying a high frequency carrier to an interaction cavity of the klystron; means for controlling the electron beam current of the klystron, whereby said high frequency carrier is maintained at a substantially constant amplitude and substantially all modulation desired on an amplified signal is provided by controlling said electron beam current and means for maintaining said high frequency carrier at a first substantially constant amplitude when an output amplified signal is required which falls within one range of amplitudes and at a second substantially constant amplitude different from the first when an output amplified signal is required which falls within another, substantially different range of amplitudes.

4. A television transmission apparatus comprising an amplifying arrangement including a klystron; means for applying a high frequency carrier to an interaction cavity of the klystron; means for controlling the electron beam current of the klystron, whereby said high frequency carrier is maintained at a substantially constant amplitude and modulation desired on an amplified signal is substantially provided by controlling said electron beam current; and means for maintainaing said high frequency carrier at a first substantially constant amplitude when an output amplified signal is required which falls within one range of amplitudes and at a second substantially constant amplitude different from the first when an output amplified signal is required which falls within another, substantially different range of amplitudes; said high frequency carrier being arranged to be maintained at said first and second substantially constant amplitudes during sync and picture periods respectively of a television signal.

* * * * *